United States Patent
Qing et al.

(10) Patent No.: US 9,543,040 B2
(45) Date of Patent: Jan. 10, 2017

(54) SHIFT REGISTER UNIT AND DRIVING METHOD THEREOF, GATE DRIVER AND DISPLAY DEVICE

(71) Applicants: CHENGDU BOE OPTOELECTRONICS TECHNOLOGY CO., LTD., Chengdu, Sichuan (CN); BOE TECHNOLOGY GROUP CO., LTD., Beijing (CN)

(72) Inventors: Haigang Qing, Beijing (CN); Xiaojing Qi, Beijing (CN)

(73) Assignees: CHENGDU BOE OPTOELECTRONICS TECHNOLOGY CO., LTD., Chengdu, Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 221 days.

(21) Appl. No.: 14/235,584

(22) PCT Filed: May 10, 2013

(86) PCT No.: PCT/CN2013/075511
§ 371 (c)(1),
(2) Date: Jan. 28, 2014

(87) PCT Pub. No.: WO2014/153813
PCT Pub. Date: Oct. 2, 2014

(65) Prior Publication Data
US 2015/0228354 A1      Aug. 13, 2015

(30) Foreign Application Priority Data

Mar. 29, 2013   (CN) .......................... 2013 1 0108110

(51) Int. Cl.
*G11C 19/36* (2006.01)
*G09G 3/36* (2006.01)
(Continued)

(52) U.S. Cl.
CPC ................. *G11C 19/36* (2013.01); *G09G 3/20* (2013.01); *G09G 3/3674* (2013.01); *G11C 19/28* (2013.01);
(Continued)

(58) Field of Classification Search
CPC . G09G 3/20; G09G 3/3674; G09G 2310/0286
(Continued)

(56) References Cited

U.S. PATENT DOCUMENTS 8,259,055 B2 *   9/2012   Sato ..................... G09G 3/3677
                                                        345/100
8,803,785 B2 *   8/2014   Takahashi ............ G11C 19/184
                                                        345/100
(Continued)

FOREIGN PATENT DOCUMENTS

| CN | 101593560 A | 12/2009 |
|----|-------------|---------|
| CN | 102654968 A | 9/2012  |
| CN | 102708616 A | 10/2012 |

OTHER PUBLICATIONS

First Chinese Office Action Appln. No. 201310108110.5; Dated Jun. 17, 2015.
(Continued)

*Primary Examiner* — Amr Awad
*Assistant Examiner* — Stephen Bray
(74) *Attorney, Agent, or Firm* — Ladas & Parry LLP (57) ABSTRACT

Provided are a shift register unit and driving method thereof, a gate driver and a display device, the circuit configuration of the shift register unit can be simplified by disposing, in the shift register unit, the signal input unit for outputting the first
(Continued)

level signal or the second level signal to the first terminal of the latch unit under the control of the input signal and the reset signal, the latch unit for latching the signal input from the signal input unit and outputting the latched processed signal to the pull-down unit, the pull-down unit for outputting the first level signal or the second level signal to the signal output unit under the control of the latched processed signal, and the signal output unit for receiving and inverting the signal output from the pull-down signal to generate an output signal and outputting a signal being opposite to the output signal, which is helpful for achieving the narrow bezel of the display panel.

17 Claims, 8 Drawing Sheets

(51) Int. Cl.
  *G11C 19/28* (2006.01)
  *G09G 3/20* (2006.01)
(52) U.S. Cl.
  CPC .............. *G09G 2310/0281* (2013.01); *G09G 2310/0286* (2013.01)

(58) Field of Classification Search
  USPC ........................................ 345/100; 377/64–81
  See application file for complete search history.

(56) References Cited

U.S. PATENT DOCUMENTS

| 2008/0143666 | A1* | 6/2008 | Wei | G11C 19/28 |
| | | | | 345/100 |
| 2008/0192883 | A1* | 8/2008 | Chang | G11C 19/28 |
| | | | | 377/64 |
| 2009/0185654 | A1* | 7/2009 | Kang | G11C 19/28 |
| | | | | 377/78 |
| 2012/0269316 | A1* | 10/2012 | Jang | G09G 3/3677 |
| | | | | 377/75 |
| 2014/0055334 | A1 | 2/2014 | Qing et al. | |

OTHER PUBLICATIONS

International Search Report Issued Sep. 10, 2013; Appln. No. PCT/CN2013/075511.
International Preliminary Report on Patentability Appln. No. PCt/CN2013/075511; Dated Sep. 29, 2015.

* cited by examiner

First level signal

Pull-down signal

Figure 7 during an input phase, the signal input unit being turned on under the control of timing sequence signals and outputting a low level, the latch unit outputting a high level while latching the low level, the pull-down unit ensuring a pull-down node at a high level under the control of the high level output from the latch unit and the timing sequence signals, the first signal output terminal in the signal output unit outputting a low level and the second signal output terminal in the signal output unit outputting a high level; — 81 during an output phase, the signal input unit being turned off under the control of the timing sequence signals, the latch unit outputting a high level continuously, the pull-down unit ensuring the pull-down node at a low level under the control of the high level output from the latch unit and the timing sequence signals, the first signal output terminal in the signal output unit outputting a high level and the second signal output terminal in the signal output unit outputting a low level — 82 during a reset phase, the signal input unit being turned on under the control of timing sequence signals and outputting a high level, the latch unit outputting a low level while latching the high level, the pull-down unit ensuring the pull-down node at a high level under the control of the low level output from the latch unit and the timing sequence signals, the first signal output terminal in the signal output unit outputting a low level and the second signal output terminal in the signal output unit outputting a high level — 83

SHIFT REGISTER UNIT AND DRIVING METHOD THEREOF, GATE DRIVER AND DISPLAY DEVICE

TECHNICAL FIELD OF THE DISCLOSURE

The present disclosure relates to a field of display technology, and particularly to a shift register unit and driving method thereof, a gate driver and a display device.

BACKGROUND

A shift register unit used in a conventional low temperature poly-silicon technology adopts D flip-flops constituted by an inverter, a NAND gate and a transmission gate, and usually comprises two D flip-flops. An output signal is latched by the D flip-flops, and the transmission and shift of the signal is controlled by a clock signal.

For a typical existing shift register, it is mainly constituted by two D flip-flops, and its operation principle is as follows: when a first D flip-flop is switched on by a clock pulse of the clock signal, the level signal input from a previous stage of unit enters into the first D flip-flop, but the level signal cannot enter into a second D flip-flop since the transmission gate at the front end of the second D flip-flop is switched off at this time; when a next clock pulse of the clock signal comes, the first D flip-flop is switched off and latches its input signal (that is, the level signal), the second D flip-flop is switched on at this time, and the input signal enters into the second D flip-flop and is output by the second D flip-flop. Thereby, the shift operation of the level signal from a previous stage of unit to an adjacent next stage of unit can be achieved.

Since the implementation of the D flip-flop includes two transmission gates, an inverter and a NAND gate, and a conventional shift register requires two D flip-flops, the conventional shift register unit has the disadvantages that a lot of gate circuits are used, the circuit configuration is too complex, a large layout space is required, all of which is not helpful for achieving a narrow bezel of a display panel, although the conventional shift register unit is classic.

SUMMARY

In embodiments of the present disclosure, there are provided a shift register unit and driving method thereof, a gate driver and a display device, for simplifying the circuit configuration of the shift register unit, which is helpful for achieving a narrow boarder of a display panel.

The particular technical solutions provided in the embodiments of the present disclosure are as follows.

According to one aspect of the present disclosure, there is provided a shift register unit including a signal input unit, a latch unit, a pull-down unit and a signal output unit, wherein the signal input unit is used for outputting a first level signal or a second level signal to a first terminal of the latch unit under the control of an input signal and a reset signal;

the latch unit is used for latching the signal input from the signal input unit and outputting a latched processed signal to the pull-down unit;

the pull-down unit is used for outputting the first level signal or a pull-down signal to the signal output unit under the control of the latched processed signal;

the signal output unit is used for receiving and inverting the signal output from the pull-down unit to generate an output signal, and outputting a signal being opposite to the output signal.

Preferably, the signal input unit includes a first thin film transistor T1 and a second thin film transistor T2; wherein the first thin film transistor T1 has a source connected to a first level signal input terminal, a gate connected to a reset signal input terminal, and a drain connected to a drain of the second thin film transistor T2 and the first terminal A of the latch unit; and the second thin film transistor T2 has a gate connected to an input signal input terminal, and a source connected to a second level signal input terminal.

Preferably, the latch unit includes a first inverter and a second inverter; wherein the first inverter has an input terminal connected to the signal input unit, and an output terminal connected to the pull-down unit; and the second inverter has an input terminal connected to the pull-down unit, and an output terminal connected to the signal input unit.

Preferably, the pull-down unit includes a fourth thin film transistor T4 and a fifth thin film transistor T5; wherein the fourth thin film transistor T4 has a drain connected to a drain of the fifth thin film transistor T5 and the signal output unit, a gate connected to a gate of the fifth thin film transistor T5 and a second terminal of the latch unit, and a source connected to a pull-down signal; and the fifth thin film transistor T5 has a source connected to the signal output unit and the first level signal input terminal.

Preferably, the pull-down unit further includes a third thin film transistor T3, wherein the third thin film transistor T3 has a drain connected to the source of the fourth thin film transistor T4, a gate connected to a clock signal input terminal, and a source connected to the second level signal input terminal.

Preferably, the pull-down unit further includes a third thin film transistor T3, wherein the third thin film transistor T3 had a drain and a gate connected to each other and connected to the source of the fourth thin film transistor T4, and a source connected to a clock signal input terminal.

Preferably, the signal output unit includes a third inverter, a first signal output terminal and a second signal output terminal;

the third inverter has a signal input terminal connected to the pull-down unit and the second signal output terminal, respectively; and the third inverter has a signal output terminal connected to the first signal output terminal.

Preferably, the signal output unit further includes a sixth thin film transistor T6; wherein the sixth thin film transistor T6 has a drain connected to the signal input terminal of the third inverter, a source connected to the first level signal input terminal, and a gate connected to the first signal output terminal.

According to another aspect of the present disclosure, there is provided a driving method of the shift register unit including:

during an input phase, the signal input unit being turned on under the control of timing sequence signals and outputting a low level, the latch unit outputting a high level while latching the low level, the pull-down unit ensuring a pull-down node at a high level under the control of the high level output from the latch unit and the timing sequence signals, the first signal output terminal in the signal output unit outputting a low level and the second signal output terminal in the signal output unit outputting a high level;

during an output phase, the signal input unit being turned off under the control of the timing sequence signals, the latch unit outputting a high level continuously, the pull-down unit ensuring the pull-down node at a low level under the control of the high level output from the latch unit and the timing sequence signals, the first signal output terminal in the signal output unit outputting a high level and the second signal output terminal in the signal output unit outputting a low level;

during a reset phase, the signal input unit being turned on under the control of timing sequence signals and outputting a high level, the latch unit outputting a low level while latching the high level, the pull-down unit ensuring the pull-down node at a high level under the control of the low level output from the latch unit and the timing sequence signals, the first signal output terminal in the signal output unit outputting a low level and the second signal output terminal in the signal output unit outputting a high level.

Preferably, during the input phase, the timing sequence signals are provided as follows: the reset signal input terminal inputs a high level, the input signal input terminal inputs a high level and a clock signal input terminal inputs a low level;

during the output phase, the timing sequence signals are provided as follows: the reset signal input terminal inputs a high level, the input signal input terminal inputs a low level and a clock signal input terminal inputs a high level;

during the reset phase, the timing sequence signals are provided as follows: the reset signal input terminal inputs a low level, the input signal input terminal inputs a low level and a clock signal input terminal inputs a low level.

Preferably, during the input phase, the timing sequence signals are provided as follows: the reset signal input terminal inputs a high level, the input signal input terminal inputs a high level and a clock signal input terminal inputs a high level;

during the output phase, the timing sequence signals are provided as follows: the reset signal input terminal inputs a high level, the input signal input terminal inputs a low level and a clock signal input terminal inputs a low level;

during the reset phase, the timing sequence signals are provided as follows: the reset signal input terminal inputs a low level, the input signal input terminal inputs a low level and a clock signal input terminal inputs a high level.

According to another aspect of the present disclosure, there is further provided a gate driver particularly including a plurality of stages of shift register units provided in the embodiments of the present disclosure; wherein except a first stage of shift register unit, the first signal output terminal of each of other stages of shift register units is connected to the input signal input terminal of an adjacent next stage of shift register unit, that is, the signal output from the first signal output terminal of each stage of shift register unit is used as the input signal of the adjacent next stage of shift register unit; and except a last stage of shift register unit, the second signal output terminal of each of other stages of shift register units is connected to the reset signal input terminal of an adjacent previous stage of shift register unit, that is, the signal output from the second signal output terminal of each stage of shift register unit is used as the reset signal of the adjacent previous stage of shift register unit.

Preferably, in the gate driver, at least two clock signals are supplied, each of the at least two clock signals is supplied to one of the plurality of stages of shift register units in an interval according to the number of the at least two clock signals.

According to another aspect of the present disclosure, there is provided a display device particularly including the gate driver provided in the embodiments of the present disclosure.

As can be seen from the above descriptions, according to the shift register unit and driving method thereof, the gate driver and the display device provided in the embodiments of the present disclosure, the circuit configuration of the shift register unit can be simplified by disposing, in the shift register unit, the signal input unit for outputting the first level signal or the second level signal to the first terminal of the latch unit under the control of the input signal and the reset signal, the latch unit for latching the signal input from the signal input unit and outputting the latched processed signal to the pull-down unit, the pull-down unit for outputting the first level signal or the second level signal to the signal output unit under the control of the latched processed signal, and the signal output unit for receiving and inverting the signal output from the pull-down signal to generate an output signal and outputting a signal being opposite to the output signal, which is helpful for achieving the narrow bezel of the display panel.

DETAILED DESCRIPTION

In order to make the purpose, the technical solutions and the advantages of the embodiments of the present disclosure more apparent, hereinafter, the technical solutions in the embodiments of the present disclosure will be described clearly and thoroughly with reference to the accompanying drawings of the embodiments of the present disclosure. Obviously, the embodiments as described are only some of the embodiments of the present disclosure, and are not all of the embodiments of the present disclosure. All other embodiments obtained by those skilled in the art based on the embodiments in the present disclosure without paying any inventive labor should fall into the protection scope of the present disclosure.

Technology terms or scientific terms used herein should have the meanings generally understood by a person who has ordinary skills in the art to which the present disclosure belongs. Terms such as "first", "second" and the like used in the specification and claims of the present disclosure do not represent any order, quantity or importance, but are only used to distinguish different components. Likewise, terms such as "a", "an" and the like do not represent any quantitative restrictions, but represent the meaning of "at least one". Terms such as "connecting", "connected" and the like are not limited to physical or mechanical connection, but can also include any electrical connection, no matter whether the connection is direct connection or indirect connection. Terms such as "above", "below", "left", "right" and the like are only used to represent relative positional relationships, the relative positional relationships will change when the absolute position of a described object changes.

Source and drain of a thin film transistor are not distinguished strictly in the specification of the present disclosure due to the characteristics that the source and the drain are symmetrical in the structure. In the specification, the names of the source and the drain of the transistor may be interchanged sometimes.

Figure 1:
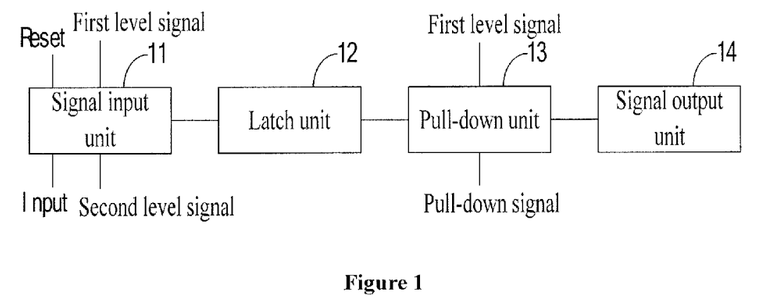
FIG. 1 is a first schematic circuit configuration of a shift register unit provided in the embodiments of the present disclosure.

In the embodiments of the present disclosure, there is provided a shift register unit, as shown in FIG. 1, the shift register unit particularly may include a signal input unit 11, a latch unit 12, a pull-down unit 13 and a signal output unit 14, wherein the signal input unit 11 is used for outputting a first level signal or a second level signal to a first terminal of the latch unit 12 under the control of an input signal Input and a reset signal Reset;

the latch unit 12 is used for latching the signal input from the signal input unit 11 and outputting a latched processed signal to the pull-down unit 13;

the pull-down unit 13 is used for outputting the first level signal or the pull-down signal to the signal output unit 14 under the control of the latched processed signal;

the signal output unit 14 is used for receiving and inverting the signal output from the pull-down unit 13 to generate an output signal, and outputting a signal being opposite to the output signal.

The shift register unit provided in the embodiment of the present disclosure has a simplified circuit configuration, which is helpful for achieving a narrow bezel of a display panel.

Figure 2:
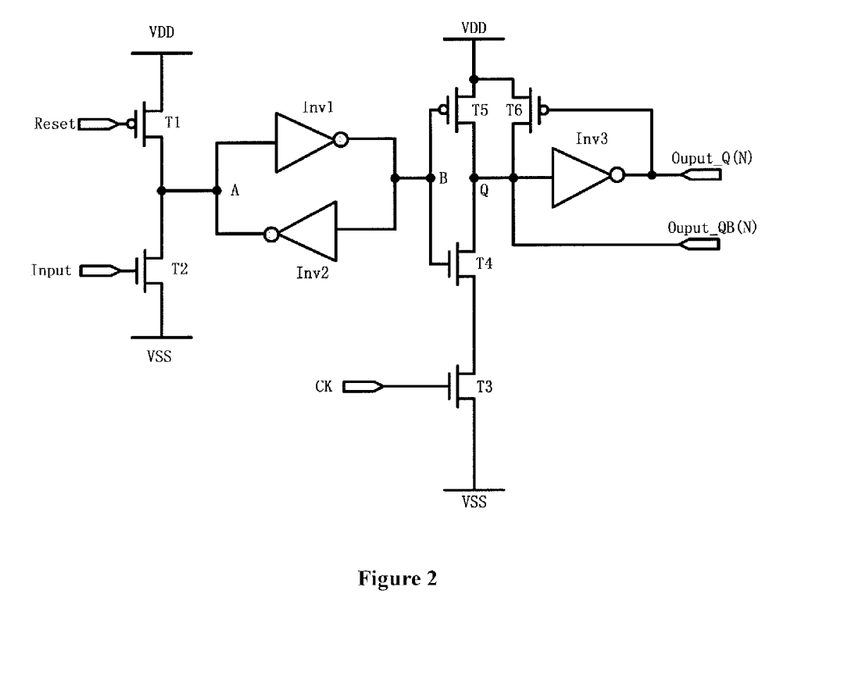
FIG. 2 is a second schematic circuit configuration of the shift register unit provided in the embodiments of the present disclosure.

In a preferred embodiment of the present disclosure, as shown in FIG. 2, 3, 4, 5, 6, the signal input unit 11 particularly includes a first thin film transistor T1 and a second thin film transistor T2; wherein the first thin film transistor T1 has a source connected to a first level signal input terminal, a gate connected to a reset signal input terminal, and a drain connected to a drain of the second thin film transistor T2 and the first terminal A of the latch unit 12; and the second thin film transistor T2 has a gate connected to an input signal input terminal, and a source connected to a second level signal input terminal.

The first level signal may be a DC high level signal VDD, or may be other signal capable of providing a high level at certain timings; the second level signal may be a DC low level signal VSS, or may be other signal capable of providing a low level at certain timings.

In the above signal input unit 11, the first thin film transistor T1 is selected as a P-type thin film transistor, and the second thin film transistor T2 is selected as an N-type thin film transistor.

The above signal input unit 11 selects the output signal of an adjacent previous shift register unit as its input signal. In addition, when the shift register unit locates at a first stage, the above signal input unit 11 selects a start signal STV as its input signal.

Meanwhile, the above signal input unit 11 selects the signal output from an adjacent next shift register unit and being opposite to the output signal of the adjacent next shift register unit as its reset signal. In addition, when the shift register unit locates at a last stage, the above signal input unit 11 selects the output signal of the last stage as its reset signal.

In a preferred embodiment of the present disclosure, as shown in FIGS. 2, 3, 4, 5, 6, the latch unit 12 particularly includes a first inverter Inv1 and a second inverter Inv2; wherein the first inverter Inv1 has an input terminal connected to the signal input unit 11, and an output terminal connected to the pull-down unit 13; and the second inverter Inv2 has an input terminal connected to the pull-down unit 13, and an output terminal connected to the signal input unit 11.

Figure 7:
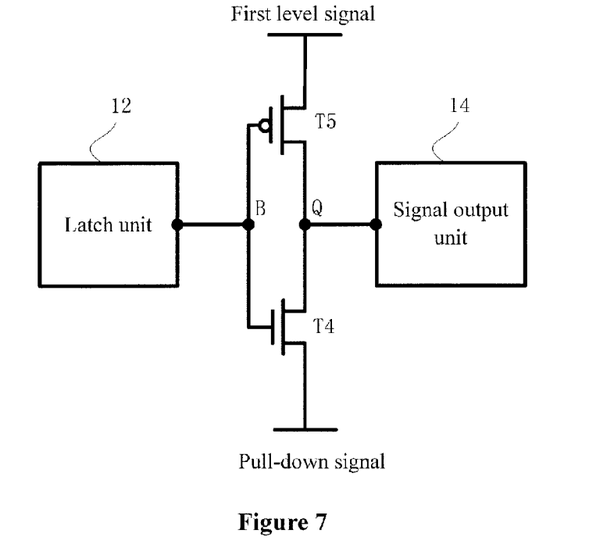
FIG. 7 is a seventh schematic circuit configuration of a shift register unit provided in the embodiments of the present disclosure.

In a preferred embodiment of the present disclosure, as shown in FIG. 7, the pull-down unit 13 particularly includes a fourth thin film transistor T4 and a fifth thin film transistor T5; wherein the fourth thin film transistor T4 has a drain connected to a drain of the fifth thin film transistor T5 and the signal output unit 14, a gate connected to a gate of the fifth thin film transistor T5 and a second terminal of the latch unit 12, and a source connected to a pull-down signal; and the fifth thin film transistor T5 has a source connected to the signal output unit 14 and the first level signal input terminal.

The fourth thin film transistor T4 is selected as an N-type thin film transistor, and the fifth thin film transistor T5 is selected as a P-type thin film transistor.

At this time, the first level signal is a DC high level signal VDD and the like, the pull-down signal is a clock signal CK or the second level signal, and the second level signal may particularly be a DC low level signal VSS and the like.

Furthermore, the pull-down unit 13 further includes a third thin film transistor T3.

Figure 3:
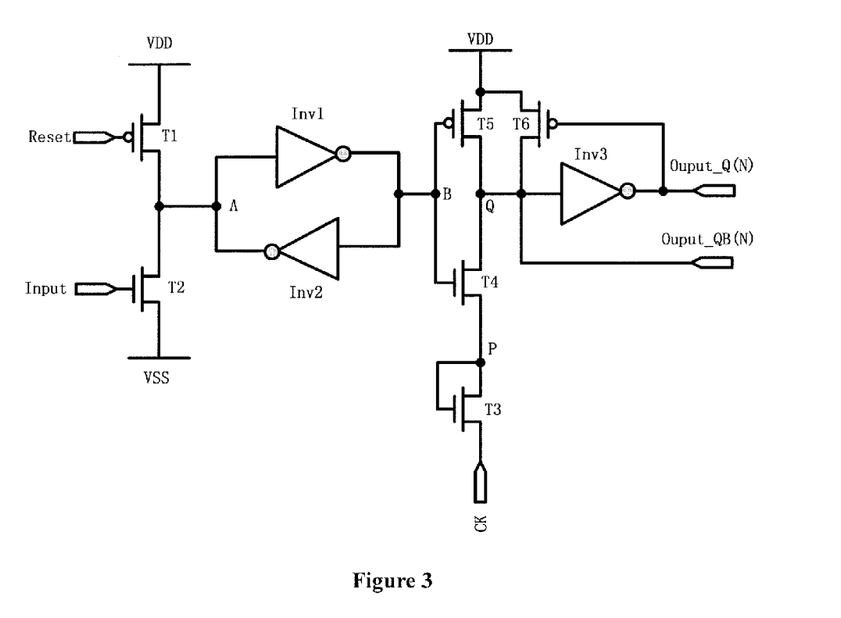
FIG. 3 is a third schematic circuit configuration of the shift register unit provided in the embodiments of the present disclosure.
Figure 4:
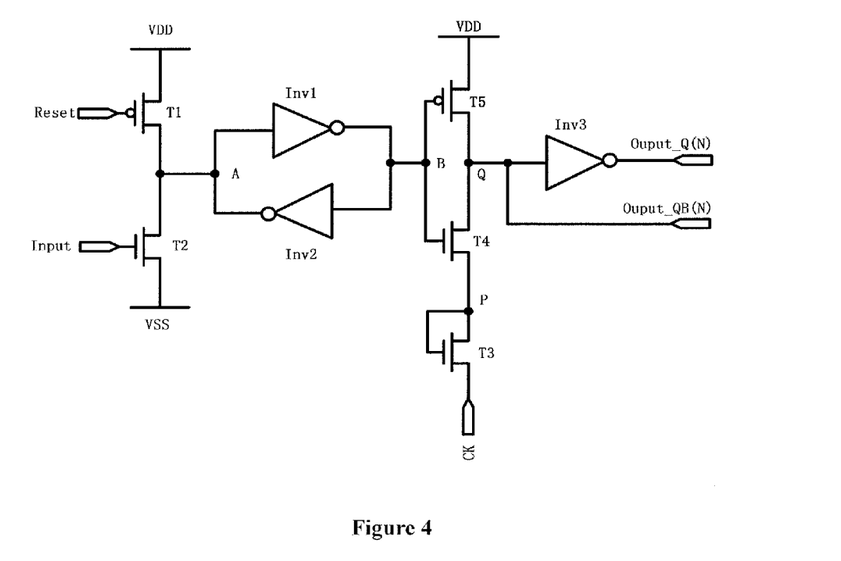
FIG. 4 is a fourth schematic circuit configuration of the shift register unit provided in the embodiments of the present disclosure.

In one example, as shown in FIGS. 3 and 4, the third thin film transistor T3 has a drain and a gate connected to each other and connected to the source of the fourth thin film transistor T4, and a source connected to the pull-down signal. At this time, the pull-down signal is the clock signal CK, the third thin film transistor T3 functions as a diode, such diode connection ensures a better transmission of a low level of the clock signal CK and blocks a high level of the clock signal CK, so that the low level of the clock signal CK is used to pull-down the level at a point Q when the circuit operates.

In another example, as shown in FIG. 2, the third thin film transistor T3 has a drain connected to the source of the fourth thin film transistor T4, a gate connected to a clock control signal CK, and a source connected to the second level signal input terminal. At this time, the pull-down signal is the second level signal, for example, a DC low level signal VSS, and the like. The clock control signal CK and the clock signal CK used as the pull-down signal are the same signal, but have different functions.

In the above examples, the third thin film transistor T3 is selected as an N-type thin film transistor.

In a preferred embodiment of the present disclosure, as shown in FIGS. 2, 3, 4, 5, 6, the signal output unit 14 may particularly include a third inverter Inv3, a first signal output terminal Output_Q(N) and a second signal output terminal Output_QB(N);

the third inverter Inv3 has a signal input terminal connected to the pull-down unit 13 and the second signal output terminal (that is, an inverted signal output terminal), respectively; and the third inverter Inv3 has a signal output terminal connected to the first signal output terminal.

Furthermore, as shown in FIGS. 2, 3, 5, 6, the signal output unit 13 further includes a sixth thin film transistor T6 (output feedback transistor).

As an example, the sixth thin film transistor T6 includes a drain connected to the signal input terminal of the third inverter Inv3, a source connected to the first level signal input terminal, and a gate connected to the first signal output terminal Output_Q(N). With the sixth thin film transistor T6, the potential of the point Q (the signal output terminal of the pull-down unit 13 or the signal input terminal of the signal output unit 14) may be controlled better.

In the above example, the sixth thin film transistor is selected as a P-type thin film transistor.

Figure 8:
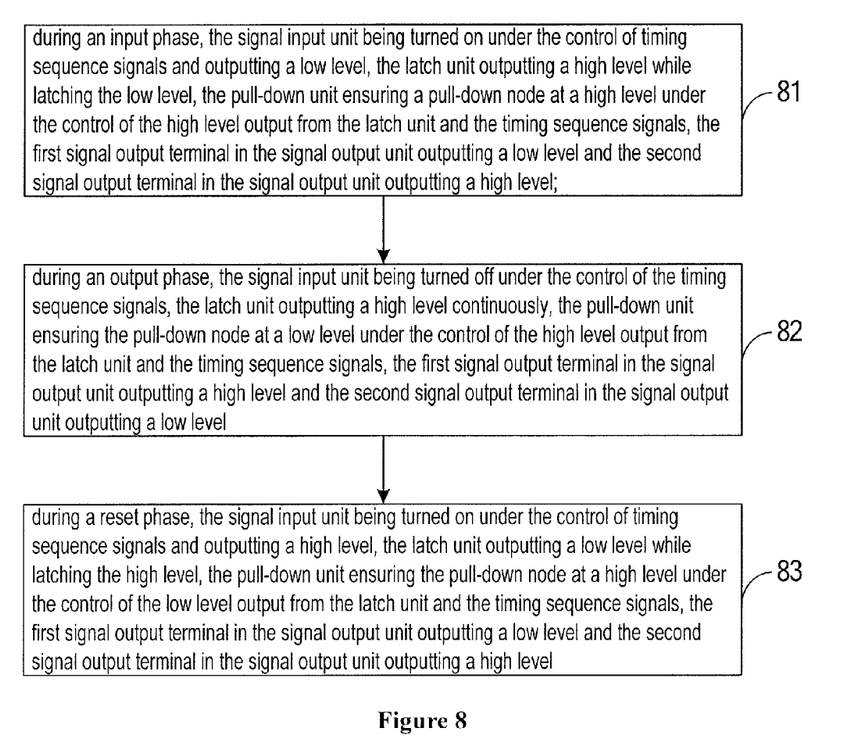
FIG. 8 is a schematic flowchart of a driving method of the shift register unit provided in the embodiments of the present disclosure.

Based on the shift register unit provided in the embodiments of the present disclosure, there is further provided a driving method for driving the shift register unit in the embodiments of the present disclosure, as shown in FIG. 8, the method may particularly include:

at step 81, that is, during an input phase, the signal input unit 11 being turned on under the control of timing sequence signals and outputting a low level, the latch unit 13 outputting a high level while latching the low level, the pull-down unit 13 ensuring a pull-down node at a high level under the control of the high level output from the latch unit 12 and the timing sequence signals, the first signal output terminal in the signal output unit 14 outputting a low level and the second signal output terminal in the signal output unit 14 outputting a high level;

at step 82, that is, during an output phase, the signal input unit 11 being turned off under the control of the timing sequence signals, the latch unit 12 outputting a high level continuously, the pull-down unit 13 ensuring the pull-down node at a low level under the control of the high level output from the latch unit 12 and the timing sequence signals, the first signal output terminal in the signal output unit 14 outputting a high level and the second signal output terminal in the signal output unit 14 outputting a low level;

at step 83, that is, during a reset phase, the signal input unit 11 being turned on under the control of timing sequence signals and outputting a high level, the latch unit 12 outputting a low level while latching the high level, the pull-down unit 13 ensuring the pull-down node at a high level under the control of the low level output from the latch unit 12 and the timing sequence signals, the first signal output terminal in the signal output unit 14 outputting a low level and the second signal output terminal in the signal output unit 14 outputting a high level.

Figure 9:
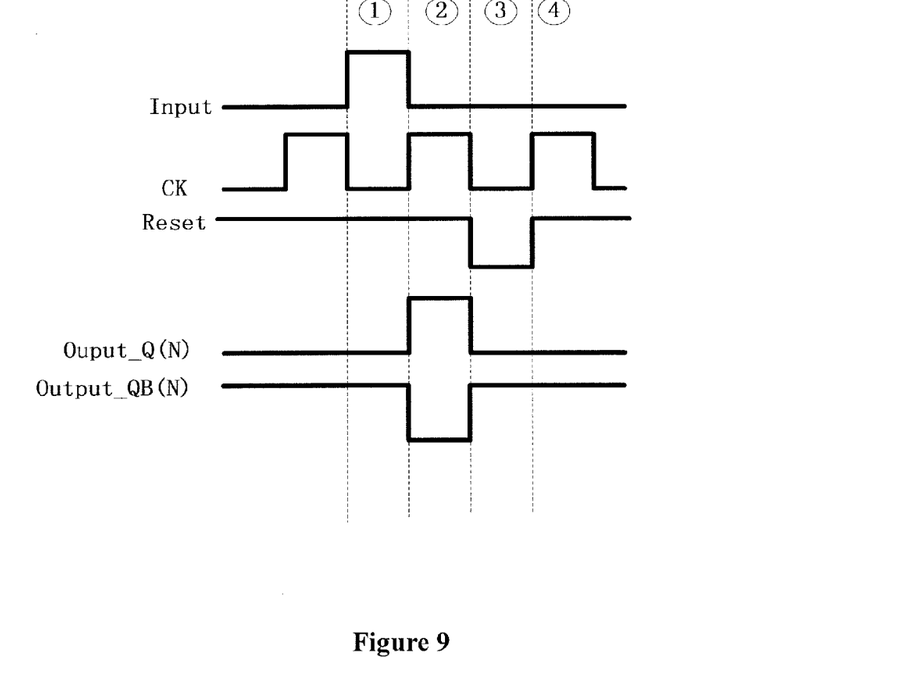
FIG. 9 is a first schematic diagram of timing sequences for the shift register unit provided in the embodiments of the present disclosure.

In the embodiments of the present disclosure, the timing sequence for the operation of the shift register unit is as shown in FIG. 9.

Below, a particular implementation of the driving method for driving the shift register provided in the embodiments of the present disclosure will be described in detail with taking a case that the shift register unit shown in FIG. 2 provided in the embodiments of the present disclosure adopts the timing sequence as shown in FIG. 9 for operation as an example.

During the input phase, the Output_Q(n−1) of an adjacent previous stage of shift register unit is at a high level and is used as the input signal Input of the shift register unit as shown in FIG. 2, particularly the high level is input from the input signal input terminal, the second thin film transistor T2 is turned on, meanwhile the first thin film transistor T1 is turned off since the reset signal Reset is at a high level, so a point A is pulled down to a low level; the latch unit 12 latches the low level and outputs a high level, the potential of a point B is at a high level; the fourth thin film transistor T4 is turned on, and the fifth thin film transistor T5 is turned off; the third thin film transistor T3 is turned off since the clock signal CK is at a low level, therefore the potential of the point Q maintains unchanged, and the first signal output terminal Output_Q(n) still outputs the original low level; meanwhile the output is fed back to be applied to the sixth thin film transistor T6, and the sixth thin film transistor T6 is turned on to help the point Q to maintain its high level continuously, such that the second signal output terminal Output_QB(n) outputs a high level.

During the output phase, the clock signal CK is at a high level, the input signal Input is at a low level, the reset signal Reset is still at a high level, the signal output from the latch unit 12 keeps unchanged, so the third and fourth thin film transistors T3 and T4 are turned on and the fifth thin film transistor T5 is turned off, the potential of the point Q is pulled down to a low level rapidly, the low level is input to the third inverter Inv3, the first signal output terminal Output_Q(n) outputs a high level, and the second signal output terminal Output_QB(n) outputs a low level.

During the reset phase, the clock signal CK is at a low level, the third thin film transistor T3 is turned off; the input signal Input is at a low level, the reset signal Reset feedback from the Output_Q(n+1) of an adjacent next stage of shift register unit is at a low level, so the potential of the point A is pulled up; the latch unit 12 latches the high level at the point A, the point B is at a low level, so the fourth thin film transistor T4 is turned off and the fifth thin film transistor T5 is turned on, the point Q is set to a high level; therefore the first signal output terminal Output_Q(n) outputs a low level, and the second signal output terminal Output_QB(n) outputs a high level.

That is, in an optional embodiment of the present disclosure, during the input phase, the timing sequence signals are provided as follows: the reset signal input terminal inputs a high level, the input signal input terminal inputs a high level and a clock signal input terminal inputs a low level;

during the output phase, the timing sequence signals are provided as follows: the reset signal input terminal inputs a high level, the input signal input terminal inputs a low level and a clock signal input terminal inputs a high level;

during the reset phase, the timing sequence signals are provided as follows: the reset signal input terminal inputs a low level, the input signal input terminal inputs a low level and a clock signal input terminal inputs a low level.

Figure 10:
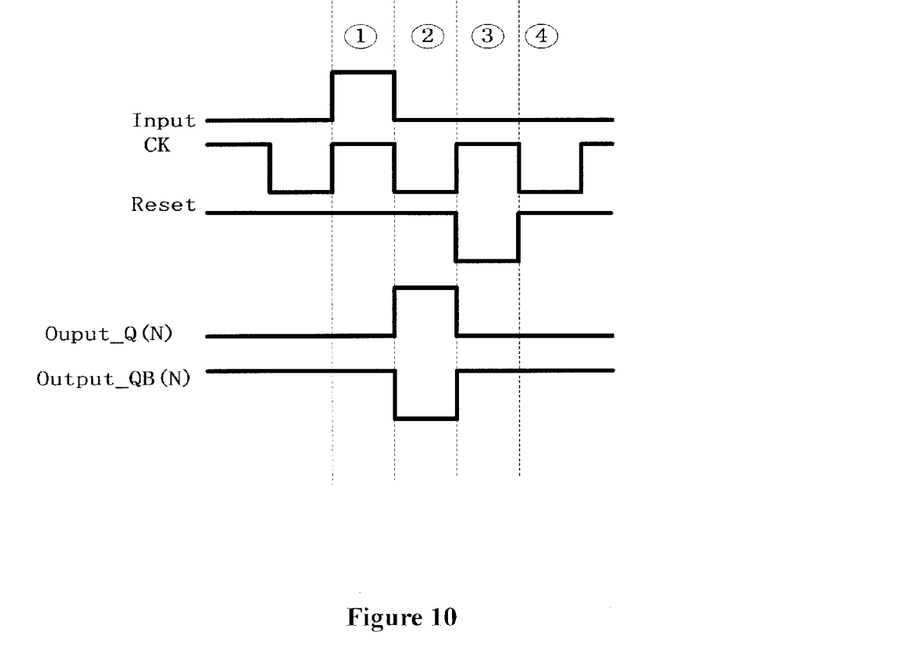
FIG. 10 is a second schematic diagram of the timing sequences for the shift register unit provided in the embodiments of the present disclosure.

In the embodiments of the present disclosure, as compared to the shift register unit shown in FIG. 2, the shift register unit shown in FIG. 3 adopts a diode connection at the clock signal input terminal (particularly the source and gate of the third thin film transistor are connected to each other to form a diode), such diode connection ensures a better transmission of a low level of the clock signal CK and blocks a high level of the clock signal CK, the low level of the clock signal CK is used to pull-down the point Q when the circuit operates, therefore the timing sequence diagram suitable to the shift register unit shown in FIG. 3 differs to that shown in FIG. 8 and may particularly be the timing sequence diagram shown in FIG. 10. In particular operations, except that the point Q is pulled down by the low level of the clock signal CK, other operations are the same as those for the driving method of the shift register unit shown in FIG. 8.

In the embodiments of the present disclosure, the circuit operations of the shift register unit shown in FIG. 4 are same as those of the shift register unit shown in FIG. 3, and the shift register unit shown in FIG. 4 also adopts a diode connected at the clock signal input terminal, the difference lies in that: the output feedback transistor T6 used in the shift register units shown in FIGS. 2 and 3 does not exist in the circuit of the shift register unit shown in FIG. 4, and the functions of the circuit and the driving method of the circuit are not affected.

Figure 5:
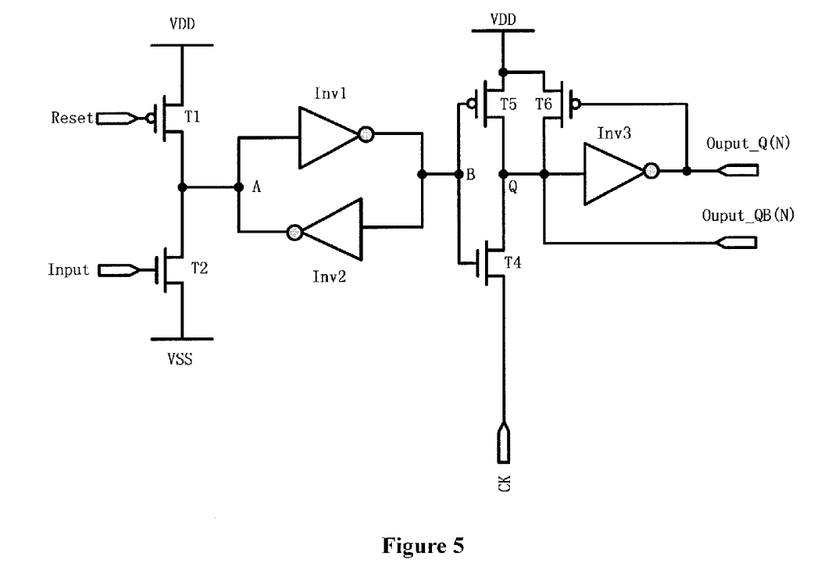
FIG. 5 is a fifth schematic circuit configuration of the shift register unit provided in the embodiments of the present disclosure.
Figure 6:
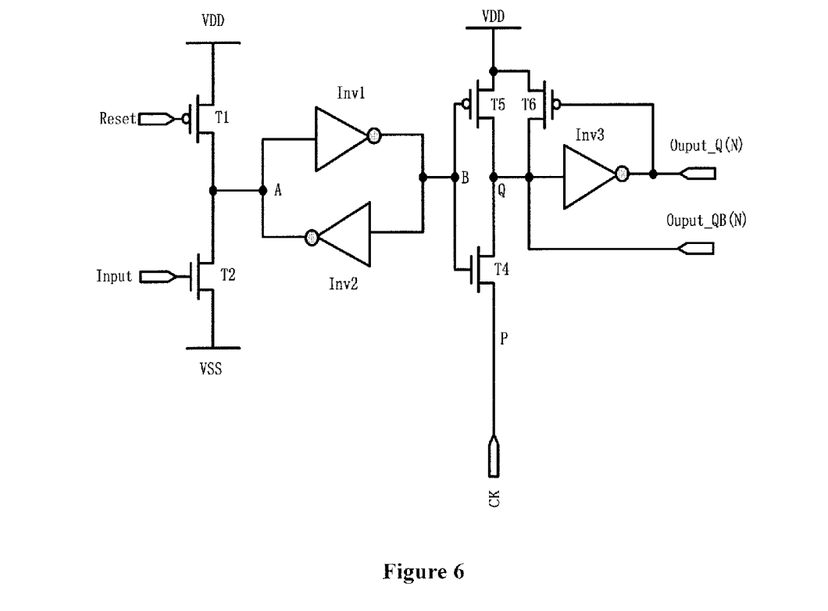
FIG. 6 is a sixth schematic circuit configuration of a shift register unit provided in the embodiments of the present disclosure.

In the embodiments of the present disclosure, the shift register units shown in FIGS. 5 and 6 are obtained by cancelling the transistor T3 on the basis of the shift register unit shown in FIG. 3 and the shift register unit shown in FIG. 4, but the operations of the particular circuits are same as those of the shift register units shown in FIGS. 3 and 4 respectively with no variation in its functions.

In the embodiments of the present disclosure, the timing sequence of signals suitable to the shift register units shown in FIGS. 4, 5 and 6 may also refer to that shown in FIG. 10.

That is, in an optional embodiment of the present disclosure, during the input phase, the timing sequence signals are provided as follows: the reset signal input terminal inputs a high level, the input signal input terminal inputs a high level and a clock signal input terminal inputs a high level;

during the output phase, the timing sequence signals are provided as follows: the reset signal input terminal inputs a high level, the input signal input terminal inputs a low level and a clock signal input terminal inputs a low level;

during the reset phase, the timing sequence signals are provided as follows: the reset signal input terminal inputs a low level, the input signal input terminal inputs a low level and a clock signal input terminal inputs a high level.

According to another aspect of the present disclosure, there is further provided a gate driver particularly including a plurality of stages of shift register units provided in the embodiments of the present disclosure; wherein except a first stage of shift register unit, the first signal output terminal of each of other stages of shift register units is connected to the input signal input terminal of an adjacent next stage of shift register unit, that is, the output signal from the first signal output terminal of each stage of shift register unit is used as the input signal of the adjacent next stage of shift register unit; and except a last stage of shift register unit, the second signal output terminal of each of other stages of shift register units is connected to the reset signal input terminal of an adjacent previous stage of shift register unit, that is, the output signal from the second signal output terminal of each stage of shift register unit is used as the reset signal of the adjacent previous stage of shift register unit.

Figure 11:
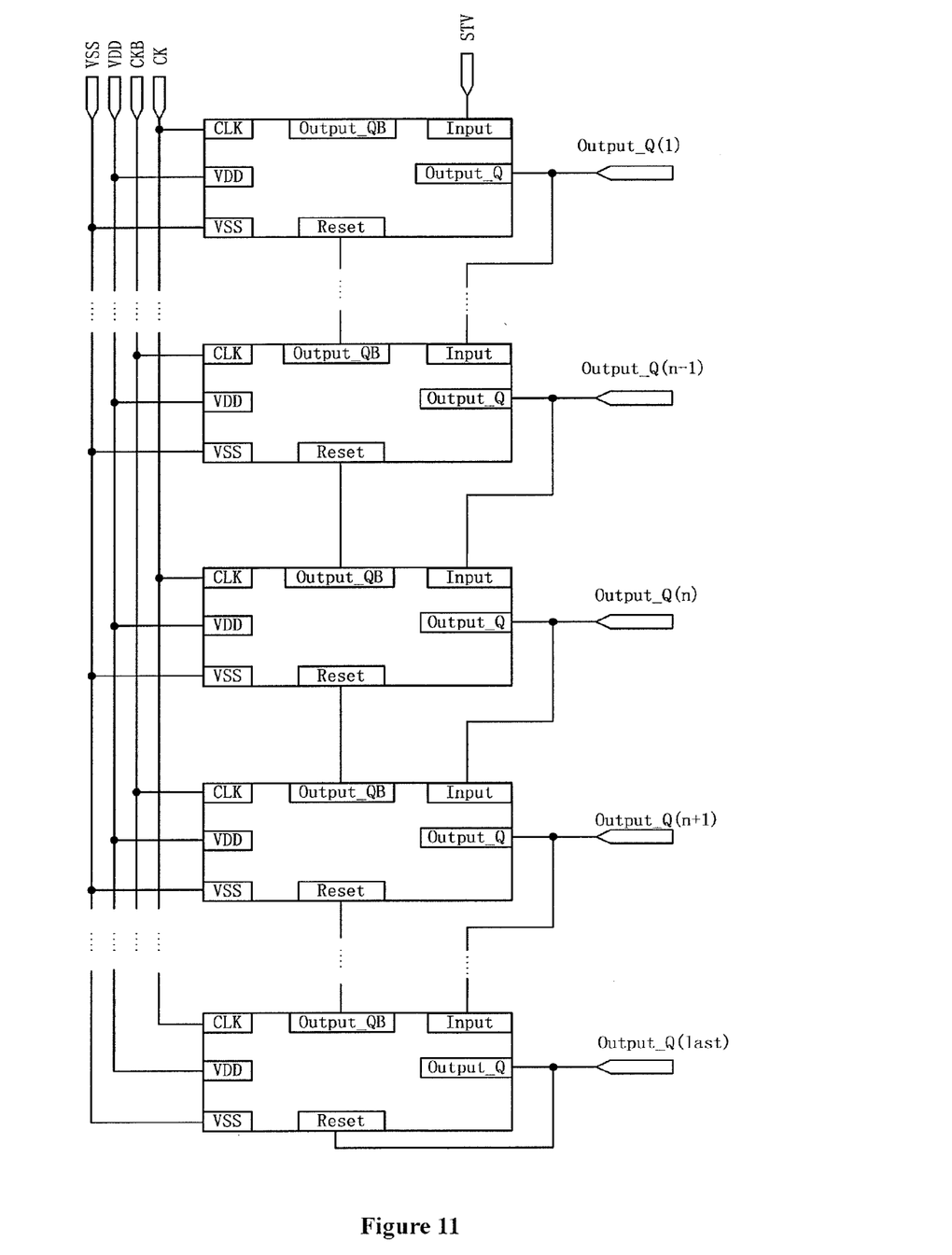
FIG. 11 is a first schematic configuration of a gate driver provided in the embodiments of the present disclosure.

In a preferred embodiment of the present disclosure, as shown in FIG. 11, in the gate driver provided in the embodiment of the present disclosure, at least two clock signals are supplied, each of the at least two clock signals is supplied to some of the plurality of stages of shift register units in an interval according to the number of the at least two clock signals.

In FIG. 10, CK is a clock signal, CKB is a clock signal being opposite to CK, Output_Q is the Output_Q(n) signal output from a $n^{th}$ stage of shift register unit (that is, a current stage of shift register unit), Output_QB is the invert Output_QB(n) signal output from a $n^{th}$ stage of shift register unit, Input is a signal input terminal for the Output_Q(n−1) signal from an adjacent previous stage of shift register unit, and Reset is a signal input terminal for the Output_QB(n+1) signal feedback from an adjacent next stage of shift register unit.

Figure 12:
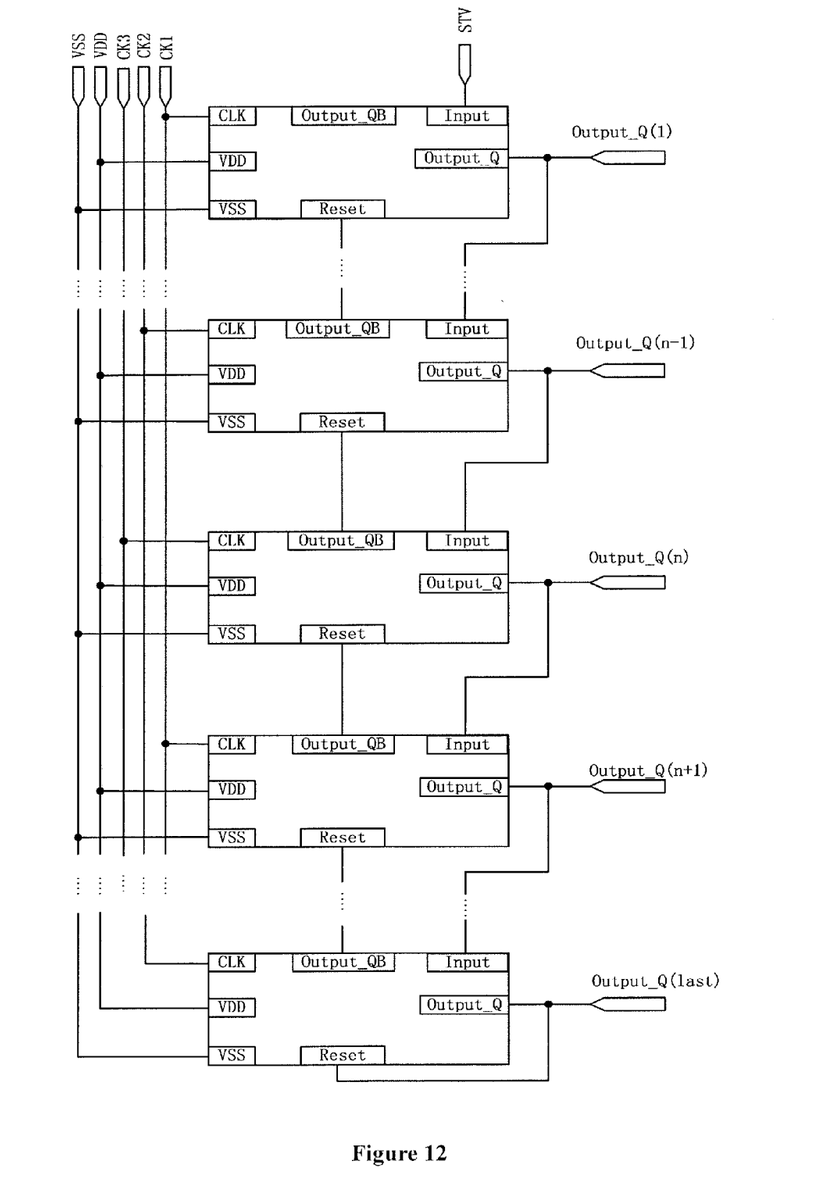
FIG. 12 is a second schematic configuration of the gate driver provided in the embodiments of the present disclosure.
Figure 13:
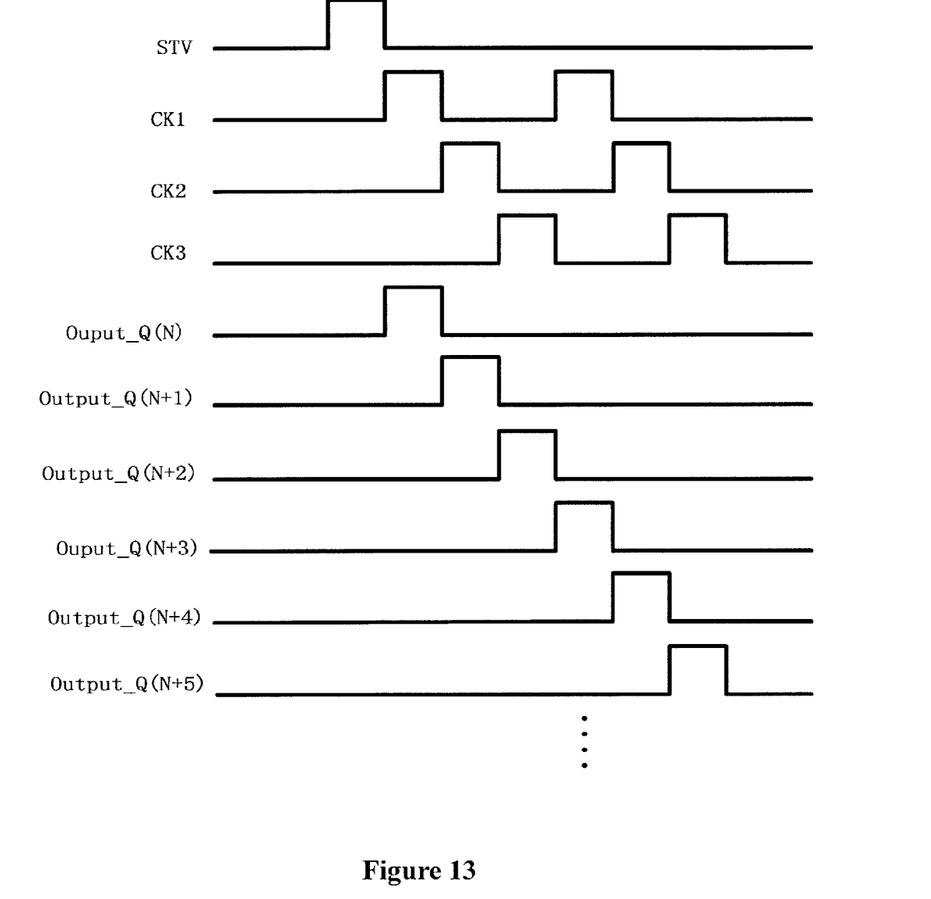
FIG. 13 is a timing sequence diagram for the operation of the gate driver provided in the embodiments of the present disclosure.

In addition, in another optional embodiment of the present disclosure, a plurality of clock signals are supplied in the gate driver provided in the embodiment of the present disclosure, for example, three clock signals or four clock signals. FIG. 12 shows a circuit configuration of a gate driver adopting three clock signals which are connected in cascade. FIG. 13 shows a timing sequence diagram corresponding to the gate driver adopting three clock signals which are connected in cascade (the shift register unit may have the circuit configuration as shown in FIG. 2).

According to another aspect of the present disclosure, there is provided a display device particularly including the gate driver provided in the embodiments of the present disclosure.

The display device may specifically be LCD panels, LCD TVs, LCD displays, OLED panels, OLED displays, plasma displays, electronic papers, etc.

The shift register unit, the gate driver and the display device provided in the embodiments of the present disclosure are particularly suitable for the requirements of GOA circuit under the LTPS (low-temperature poly-silicon technology) process, but also may be applicable to the GOA circuit under the amorphous silicon technology process.

As can be seen from the above description, according to the shift register unit and driving method thereof, the gate driver and the display device provided in the embodiments of the present disclosure, the circuit configuration of the shift register unit can be simplified by disposing, in the shift register unit, the signal input unit, the latch unit, the pull-down unit, the signal output unit, the reset signal input terminal, the initial signal input terminal, the DC high level signal input terminal, the DC low level signal input terminal and the clock signal input terminal, which is helpful for achieving the narrow bezel of the display panel.

The above descriptions are only for illustrating the embodiments of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A shift register unit, including a signal input unit, a latch unit, a pull-down unit and a signal output unit, wherein the signal input unit is used for outputting a first level signal or a second level signal to a first terminal of the latch unit under the control of an input signal and a reset signal;

the latch unit is used for latching the signal input from the signal input unit and outputting a latched processed signal to the pull-down unit;

the pull-down unit is used for outputting the first level signal or a pull-down signal to the signal output unit under the control of the latched processed signal; and the signal output unit is used for receiving and inverting the signal output from the pull-down unit to generate an output signal, and outputting a signal being opposite to the output signal, wherein the pull-down unit includes a fourth thin film transistor T4 and a fifth thin film transistor T5;

the fourth thin film transistor T4 has a drain connected to a drain of the fifth thin film transistor T5 and the signal output unit, a gate connected to a gate of the fifth thin film transistor T5 and a second terminal of the latch unit, and a source connected to a pull-down signal; and the fifth thin film transistor T5 has a source directly connected to the signal output unit and the first level signal input terminal.

2. The shift register unit of claim 1, wherein the signal input unit includes a first thin film transistor T1 and a second thin film transistor T2; wherein the first thin film transistor T1 has a source connected to a first level signal input terminal, a gate connected to a reset signal input terminal, and a drain connected to a drain of the second thin film transistor T2 and the first terminal A of the latch unit; and the second thin film transistor T2 has a gate connected to an input signal input terminal, and a source connected to a second level signal input terminal.

3. The shift register unit of claim 1, wherein the latch unit includes a first inverter and a second inverter; wherein the first inverter has an input terminal connected to the signal input unit, and an output terminal connected to the pull-down unit; and the second inverter has an input terminal connected to the pull-down unit, and an output terminal connected to the signal input unit.

4. The shift register unit of claim 1, wherein the pull-down unit further includes a third thin film transistor T3, wherein the third thin film transistor T3 had a drain connected to the source of the fourth thin film transistor T4, a gate connected to a clock signal input terminal, and a source connected to the second level signal input terminal.

5. The shift register unit of claim 1, wherein the pull-down unit further includes a third thin film transistor T3, wherein the third thin film transistor T3 had a drain and a gate connected to each other and connected to the source of the fourth thin film transistor T4, and a source connected to a clock signal input terminal.

6. The shift register unit of claim 1, wherein the signal output unit includes a third inverter, a first signal output terminal and a second signal output terminal;

the third inverter has a signal input terminal connected to the pull-down unit and the second signal output terminal, respectively; and the third inverter has a signal output terminal connected to the first signal output terminal.

7. The shift register unit of claim 6, wherein the signal output unit further includes a sixth thin film transistor T6; wherein the sixth thin film transistor T6 has a drain connected to the signal input terminal of the third inverter, a source connected to the first level signal input terminal, and a gate connected to the first signal output terminal.

8. A driving method of a shift register unit according to claim 1, including:

during an input phase, the signal input unit being turned on under the control of timing sequence signals and outputting a low level, the latch unit outputting a high level while latching the low level, the pull-down unit ensuring a pull-down node at a high level under the control of the high level output from the latch unit and the timing sequence signals, the first signal output terminal in the signal output unit outputting a low level and the second signal output terminal in the signal output unit outputting a high level;

during an output phase, the signal input unit being turned off under the control of the tiring sequence signals, the latch unit outputting a high level continuously, the pull-down unit ensuring the pull-down node at a low level under the control of the high level output from the latch unit and the timing sequence signals, the first signal output terminal in the signal output unit outputting a high level and the second signal output terminal in the signal output unit outputting a low level;

during a reset phase, the signal input unit being turned on under the control of timing sequence signals and outputting a high level, the latch unit outputting a low level while latching the high level, the pull-down unit ensuring the pull-down node at a high level under the control of the low level output from the latch unit and the timing sequence signals, the first signal output terminal in the signal output unit outputting a low level and the second signal output terminal in the signal output unit outputting a high level.

9. The method of claim 8, wherein during the input phase, the timing sequence signals are provided as follows: the reset signal input terminal inputs a high level, the input signal input terminal inputs a high level and a clock signal input terminal inputs a low level;

during the output phase, the timing sequence signals are provided as follows: the reset signal input terminal inputs a high level, the input signal input terminal inputs a low level and a clock signal input terminal inputs a high level;

during the reset phase, the timing sequence signals are provided as follows: the reset signal input terminal inputs a low level, the input signal input terminal inputs a low level and a clock signal input terminal inputs a low level.

10. The method of claim 8, wherein during the input phase, the timing sequence signals are provided as follows: the reset signal input terminal inputs a high level, the input signal input terminal inputs a high level and a clock signal input terminal inputs a high level;

during the output phase, the timing sequence signals are provided as follows: the reset signal input terminal inputs a high level, the input signal input terminal inputs a low level and a clock signal input terminal inputs a low level;

during the reset phase, the timing sequence signals are provided as follows: the reset signal input terminal inputs a low level, the input signal input terminal inputs a low level and a clock signal input terminal inputs a high level.

11. A gate driver including a plurality of stages of shift register units; wherein the shift register unit includes a signal input unit, a latch unit, a pull-down unit and a signal output unit, wherein the signal input unit is used for outputting a first level signal or a second level signal to a first terminal of the latch unit under the control of an input signal and a reset signal;

the latch unit is used for latching the signal output from the signal input unit and outputting a latched processed signal to the pull-down unit;

the pull-down unit is used for outputting the first level signal or the second level signal to the signal output unit under the control of the latched processed signal; and the signal output unit is used for receiving and inverting the signal output from the pull-down unit to generate an output signal, and outputting a signal being opposite to the output signal; wherein the pull-down unit includes a fourth thin film transistor T4 and a fifth thin film transistor T5;

the fourth thin film transistor T4 has a drain connected to a drain of the fifth thin film transistor T5 and the signal output unit, a gate connected to a gate of the fifth thin film transistor T5 and a second terminal of the latch unit, and a source connected to a pull-down signal; and the fifth thin film transistor T5 has a source directly connected to the signal output unit and the first level signal input terminal, except a last stage of shift register unit, a first signal output terminal of each of other stages of shift register units is connected to an input signal input terminal of an adjacent next stage of shift register unit, that is, an output signal from the first signal output terminal of each stage of shift register unit is used as the input signal of the adjacent next stage of shift register unit; and except a first stage of shift register unit, a second signal output terminal of each of other stages of shift register units is connected to a reset signal input terminal of an adjacent previous stage of shift register unit, that is, an output signal from the second signal output terminal of each stage of shift register unit is used as the reset signal of the adjacent previous stage of shift register unit.

12. The gate driver of claim 11, wherein the signal input unit includes a first thin film transistor T1 and a second thin film transistor T2; wherein the first thin film transistor T1 has a source connected to a first level signal input terminal, a gate connected to a reset signal input terminal, and a drain connected to a drain of the second thin film transistor T2 and the first terminal A of the latch unit; and the second thin film transistor T2 has a gate connected to an input signal input terminal, and a source connected to a second level signal input terminal.

13. The gate driver of claim 11, wherein the latch unit includes a first inverter and a second inverter; wherein the first inverter has an input terminal connected to the signal input unit, and an output terminal connected to the pull-down unit; and the second inverter has an input terminal connected to the pull-down unit, and an output terminal connected to the signal input unit.

14. The gate driver of claim 11, wherein at least two clock signals are supplied, each of the at least two clock signals is supplied to some of the plurality of stages of shift register units in an interval according to the number of the at least two clock signals.

15. A display device including the gate driver; wherein the gate driver including a plurality of stages of shift register units; the shift register unit includes a signal input unit, a latch unit, a pull-down unit and a signal output unit, wherein the signal input unit is used for outputting a first level signal or a second level signal to a first terminal of the latch unit under the control of an input signal and a reset signal;

the latch unit is used for latching the signal input from the signal input unit and outputting a latched processed signal to the pull-down unit;

the pull-down unit is used for outputting the first level signal or a pull-down signal to the signal output unit under the control of the latched processed signal; and the signal output unit is used for receiving and inverting the signal output from the pull-down unit to generate an output signal, and outputting a signal being opposite to the output signal; wherein the pull-down unit includes a fourth thin film transistor T4 and a fifth thin film transistor T5;

the fourth thin film transistor T4 has a drain connected to a drain of the fifth thin film transistor T5 and the signal output unit, a gate connected to a gate of the fifth thin film transistor T5 and a second terminal of the latch unit, and a source connected to a pull-down signal; and the fifth thin film transistor T5 has a source directly connected to the signal output unit and the first level signal input terminal, except a last stage of shift register unit, a first signal output terminal of each of other stages of shift register units is connected to an input signal input terminal of an adjacent next stage of shift register unit, that is, an output signal from the first signal output terminal of each stage of shift register unit is used as the input signal of the adjacent next stage of shift register unit; and except a first stage of shift register unit, a second signal output terminal of each of other stages of shift register units is connected to a reset signal input terminal of an adjacent previous stage of shift register unit, that is, an output signal from the second signal output terminal of each stage of shift register unit is used as the reset signal of the adjacent previous stage of shift register unit.

16. The display device of claim 15, wherein the signal input unit includes a first thin film transistor T1 and a second thin film transistor T2; wherein the first thin film transistor T1 has a source connected to a first level signal input terminal, a gate connected to a reset signal input terminal, and a drain connected to a drain of the second thin film transistor T2 and the first terminal A of the latch unit; and the second thin film transistor T2 has a gate connected to an input signal input terminal, and a source connected to a second level signal input terminal.

17. The display device of claim 15, wherein the latch unit includes a first inverter and a second inverter; wherein the first inverter has an input terminal connected to the signal input unit, and an output terminal connected to the pull-down unit; and the second inverter has an input terminal connected to the pull-down unit, and an output terminal connected to the signal input unit.

* * * * *